United States Patent
Hubel

(10) Patent No.: US 7,033,468 B2
(45) Date of Patent: Apr. 25, 2006

(54) ELASTIC CONTACT ELEMENT

(75) Inventor: Egon Hubel, Feucht (DE)

(73) Assignee: Atotech Deutschland GmbH, Berlin (DE)

( * ) Notice: Subject to any disclaimer, the term of this patent is extended or adjusted under 35 U.S.C. 154(b) by 464 days.

(21) Appl. No.: 10/240,785

(22) PCT Filed: Apr. 11, 2001

(86) PCT No.: PCT/DE01/01512

§ 371 (c)(1),
(2), (4) Date: Oct. 3, 2002

(87) PCT Pub. No.: WO01/81657

PCT Pub. Date: Nov. 1, 2001

(65) Prior Publication Data

US 2003/0051999 A1    Mar. 20, 2003

(30) Foreign Application Priority Data

Apr. 20, 2000  (DE)  ................. 100 19 713

(51) Int. Cl.
  C25B 9/00  (2006.01)
(52) U.S. Cl. ............ 204/279; 204/199; 204/202; 204/212
(58) Field of Classification Search ......... 204/279, 204/199, 202, 212
See application file for complete search history.

(56) References Cited

U.S. PATENT DOCUMENTS 2,342,811 A    2/1944 Martin .............. 204/206

FOREIGN PATENT DOCUMENTS

| DE | 36 03 856 A1 | 2/1986 |
| DE | 43 24 330 A1 | 7/1993 |
| EP | 0 959 153 A2 | 11/1999 |
| JP | 56029695 | * 3/1981 |
| JP | 06010186 | * 1/1994 |
| WO | WO 92/18669 | 4/1992 |

OTHER PUBLICATIONS

EPO, Patent Abstracts of Japan, Appln No. 04190178, dated Jun. 25, 1992.
EPO, Patent Abstracts if Japan, Appln No. 54105792, dated Aug. 20, 1979.
EPO, Patent Abstracts of Japan, Appln No. 05023056, dated Oct. 2, 1993.
Patent Abstracts of Japan, Publication No. 63-297588, dated May 12, 1988.

* cited by examiner

Primary Examiner—Bruce F. Bell
(74) Attorney, Agent, or Firm—Paul & Paul

(57) ABSTRACT

For manufacturing printed circuit boards and films 7 with little variations in the layer thickness of the circuit structures without damaging the surfaces of the boards and films, a rotatory element 9, 10, more specifically a contact roll, is used for placing the printed circuit boards and films in electric contact, an elastic, electrically conductive material 2, 5, 6 being at least partially applied on the running tread unreeling on the printed circuit boards and films.

7 Claims, 1 Drawing Sheet

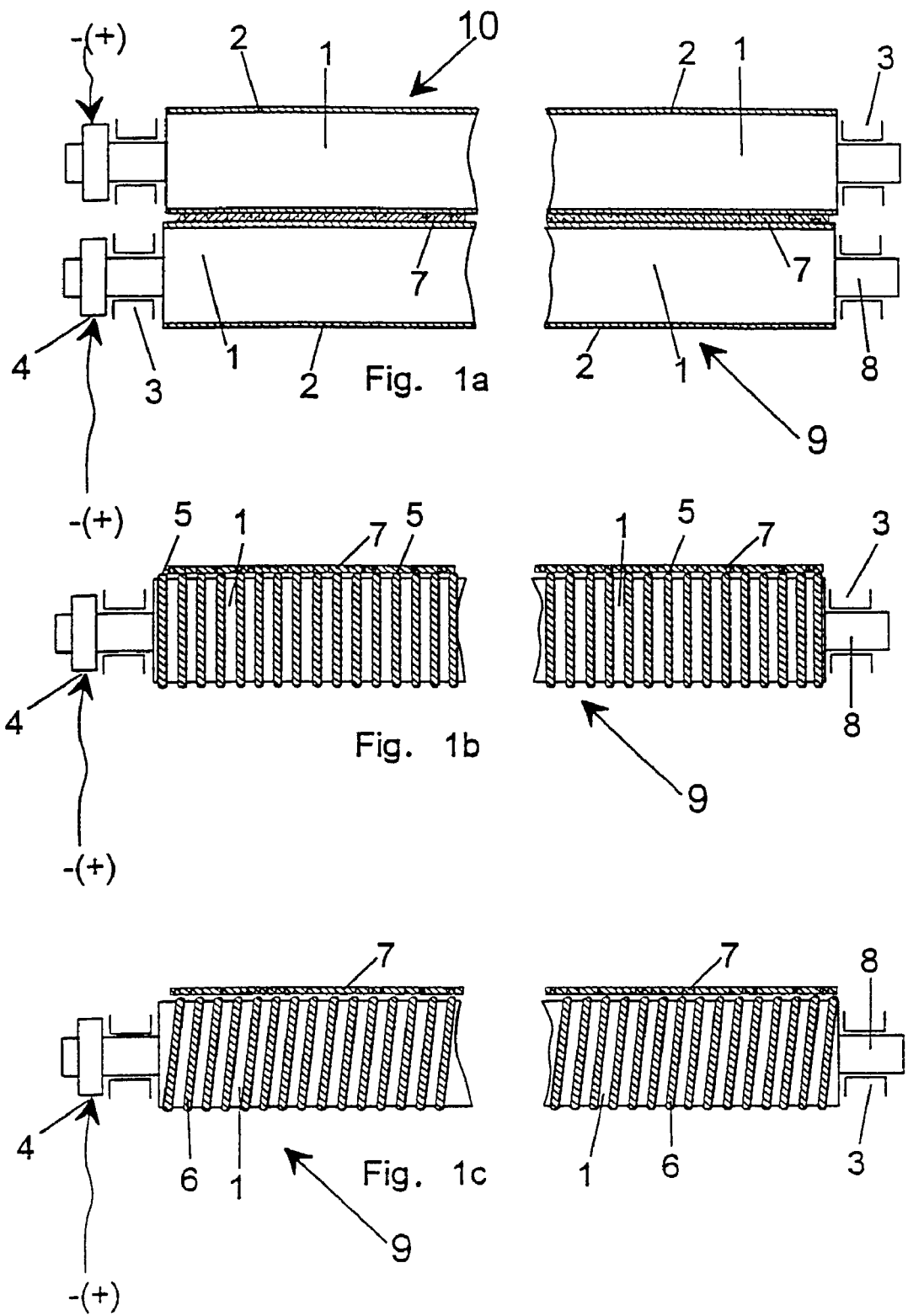

ELASTIC CONTACT ELEMENT

CROSS-REFERENCE TO RELATED APPLICATIONS

This application is a national phase under 35 USC 371 of International application number PCT/DE01/01512 filed on Apr. 11, 2001.

BACKGROUND OF THE INVENTION

1. Field of the Invention

The present invention relates to placing flat work in electric contact when carrying out electrolytic processes in continuous processing plants, preferably for processing printed circuit boards and printed circuit films.

2. Description of Related Art

Electrolytic methods are used for manufacturing printed circuit boards. Metal, mostly copper, is more specifically deposited to form strip conductors and soldering and bonding places. Generally, the starting material consists of dielectric boards or films that are coated with copper layers on either side. After through bores have been made through the material, a layer of copper, of, e.g. 30 µm thick, is applied all over the surfaces, a layer of copper being deposited on the walls of the bores as well. In order to be able to strip conductors delineations and other metal structures, in a variant of the method, a structured mask is first applied to the surfaces of the boards or films resp., those regions of the surface remaining bare in which the structures are to be formed. For this purpose, the conductive pattern is printed in negative. This is performed by means of screen-printing and, with fine-line printed circuits, by means of reproduction techniques (photoresist). A layer of photoresist usually has a thickness of from 25 µm to 40 µm and constitutes a high-quality electric insulator. No metal is to be deposited onto the resist during patterning. Subsequently, metal is deposited in those regions of the covering mask that had been kept bare and the metal covered by the covering mask is finally removed by etching once the mask has been taken off. This method is referred to as pattern plating process.

In the electrolytic process, a conductive surface to be electrolytically processed must be electrically connected to the power source required for this purpose. On electroplating it is the negative pole that has to contact this surface, on etching, it is the positive pole, the respective opposite pole being electrically connected to a counter electrode which contacts a processing fluid as does the surface to be processed. In continuous processing plants of the printed circuit board technique, contact is made among others with rolls. The work, the printed circuit boards, is for example conveyed in horizontal direction through the various wet-chemical processing and rinsing stations by means of lower and upper driven rolls or wheels. The rolls are usually made from a material that resists the electrolyte used, such as for example PP (polypropylene), PE (polyethylene) or PVC (polyvinyl chloride). Rolls provided with a sponge coating whose pores are either open or closed are used for squeezing fluids out and for simultaneous transportation.

For placing the surfaces of the printed circuit boards in electric contact in electrolytic processing plants, pairs of metallic contacting rolls that is, upper and lower rolls are employed. The current from the power source of the bath is delivered to said rolls by way of a sliding contact for example. The metallic surface of each roll unreels on the surface of the boards to be processed. These rolls serve to convey the work and concurrently to transmit power to its surface.

Such a device for electroplating printed circuit boards is described in DE 36 03 856 A1. Inside the electroplating plant, a pair of rotary rolls serving as a cathode take hold of and convey the printed circuit boards. The rolls consist of stainless special steel or titanium.

A similar device is described in EP 0 959 153 A2: metal rolls are arranged on either side of a horizontal conveying plane. The printed circuit boards to be processed are placed in electric contact by way of these rolls. For this purpose, an electrical connection is made between an external power source and the metal rolls via a rotating current transmission device.

The document JP-A-63-297588, Patent Abstracts of Japan, discloses an electrolytic method of processing electrically isolated circuit structures on printed circuit boards. For electroplating, the sometimes very small isolated areas are placed in electric contact by means of a rotating metallic brush.

The known devices and methods do not permit to deposit metal layers of uniform thickness without damaging the printed circuit boards. For it has been found that variations occur in the thickness of the coatings in particular when large sized boards are being electrolytically processed and that the boards may even be damaged in the course of processing. It has also been found that the coating thickness of the individual strip conductors can also vary within a wide range when electroplating conductors patterns during the pattern-plating-process. The known documents do not discuss why these problems occur and how to eliminate them.

SUMMARY OF THE INVENTION

The present invention relates to placing flat work in electric contact when carrying out electrolytic processes in continuous processing plants, preferably for processing printed circuit boards and printed circuit films. The invention more specifically relates to a rotary element for placing work that is to be electrolytically processed in electric contact, to an array of at least two rotary elements for placing the work in electric contact as well as to a method of placing the work in electric contact. The invention relates to both electroplating and electrolytic etching.

The basic problem of the present invention is therefore to avoid the drawbacks of the known methods and more specifically to find measures that make it possible to produce circuit structures on printed circuit boards and printed circuit films with little variation in the coating thickness and without damaging the surfaces of the boards or the films in the patterning process. Large sized boards as well as finest circuit lines in particular are to be produced without problem and more specifically with error-free circuit structures.

The problem is solved by the present invention.

The rotary element according to the invention and the method serve to place board-shaped work that is to be electrolytically processed in electric contact in a continuous processing plant. Such plants are often used for producing printed circuit boards and films. According to the invention, the rotary element is at least partially provided, on its running tread unreeling on the work, with an elastic, electrically conductive material. As a result thereof, the work is at least partially placed in electric contact by way of the elastic, electrically conductive material.

The rotary element is preferably designed as a contact roll, But it may also be designed as a contact wheel or a contact spiral. In the latter case. the spiral is a spiral that is connected at its ends with a drive and that is more specifically unsupported and preferably made from metal.

If contact rolls are utilized, the surface areas of the contact rolls, which unreel on the surfaces of the work, are, in a first embodiment, at least mainly, preferably completely, that is in whole or in part coated with the elastic, electrically conductive material.

This material is created by inclusion of an electrically conductive filling material which renders it a good conductor. As a result thereof, such contact rolls are surprisingly well suited for transmitting the high current required for electrolytic processing. Concurrently, as compared to the metallic contact rolls of the prior art, the usually sensitive surfaces of the printed circuit boards are contacted in a very gentle way.

Although brushes are on principle suited for placing electrically isolated circuit structures on dielectric material into contact to process them electrolytically, it has been found that metal preferentially deposits on the brushes during electroplating, thus stiffening the bristles. This causes the work to get damaged. This is the reason why the device described in JP-A-63-297588 is not well suited for producing printed circuit boards and films.

The contact brush of the prior art described is moreover suited for low currents only, because the bristles of the brush need to be very thin and flexible. If larger sections of the bristles are chosen for transmitting higher currents, the quality of the surface sustains damage from scratching. Furthermore, the baths are soiled by breaking bristles. These particles of the brushes are also electroplated onto the upper side of the printed circuit boards in horizontal continuous processing plants. Complete refuse ensues.

The problems mentioned are circumvented by using the rotatory elements according to the invention. There are in particular no limitations with respect to the current density to be used. The contacting element is additionally sufficiently abrasion resistant so that the processing fluid may hardly be soiled thereby.

To avoid plating of the contacting elements themselves, DE 36 03 856 A1 and EP 0 959 153 A2 provide embodiments of the contact rolls described therein which are provided with particular shielding measures.

However, the metallic contact rolls known from DE 36 03 856 A1 and EP 0 959 153 A2 must be produced with great accuracy and must also be accurately positioned in the continuous processing plant, all the more when the work is thin. In the fine line printed circuit technique, the films to be processed are getting increasingly thinner. When manufacturing is not precise, that is when the axes of the rolls are not aligned, only parts of the upper and lower rolls rest with the intended pressure force on the film. The other surface lines of the rolls do not contribute to transmit the current. On the other hand, thicker printed circuit boards like for example multilayers, are never completely plane. According to the international standards PERFAG 2D and IPC-TM-650 Number 2.4.22 for example, a maximum arch of 1.0% is permissible with a board thickness ranging from 1.5 mm to 3.2 mm. When a board extends to have a border length of, e.g. 400 mm, the still permissible arch accordingly amounts to 4 mm. As a result, the contact rolls do not rest on the entire surface line not even with thick, always very rigid boards. Problems with the transfer of current ensue that can even cause the printed circuit boards to be damaged.

BRIEF DESCRIPTION OF THE DRAWINGS

FIG. 1a: shows a side view of a contact roll according to the invention with an elastic, electrically conductive coating applied all over it;

FIG. 1b: shows a side view of a contact roll according to the invention with annular contact strips;

FIG. 1c: shows a side view of a contact roll according to the invention with spiral contact strips.

DETAILED DESCRIPTION OF THE INVENTION

These problems also are avoided with the rotatory element according to the invention. It may more particularly be achieved that the contact elements rest uniformly on the surface to be plated.

Contact making with rigid rolls is completely unsuited for electroplating a conductive pattern on printed circuit boards and films according to the pattern-plating-process. The thickness of the insulating varnish prevents a rigid contact roll from reaching the metal layers to be electroplated that are located in the cavities and are in most cases made from copper. As a result thereof, the copper located in the cavities formed by the photoresist cannot be placed into electric contact. Accordingly, it is impossible to perform electrolytic patterning of such printed circuit boards with these contact rolls. The contact brush described in JP-A-63-297588 is also totally unsuited for placing into electric contact because of the disadvantages described herein above. What is more, the brushes scratch the sensitive varnish and damage the edges of the varnish.

The Shore hardness of the elastic material to be used on the rotatory element according to DIN 53 505 depends on its application:

The elastic material can be made harder when printed circuit boards and films are electrolytically processed all over than when electrolytic patterning (pattern-plating-process) is to be carried out, in which only those circuit structures are to be plated that are lying in cavities in the photoresist mask. Elasticity is needed in the first place for compensating arches of the printed circuit boards and regions of varying thickness of the work and for compensating mechanical tolerances of the roll bearing as well as furthermore for protecting the surfaces against damages such as scratches, pressure marks and current burn marks.

On patterning, more specifically in the fine line printed circuit technique, a largest possible proportion of the contact-making surface line of the roll is to reach, that is to electrically contact, the metallic surface that lies, at the beginning of the treatment, deeper by the thickness of the photoresist. For this purpose, the contact-making material needs to have a greater elasticity in order to bridge the difference in height with respect to the cavities. But it is not necessary that the entire surface line makes contact at every instant in time, that is on the conductive pattern passing the continuous processing plant. On each panel to be produced there are larger contact areas like for example the subsequently cut off borders. These are to be found both on the upper side and on the underside of a printed circuit board. Both sides are electrically conductively interconnected at the borders and by the many contacted through holes.

What is more, the area to be electroplated during patterning is always smaller than it is with overall processing. The current to be transmitted by way of the contact rolls is accordingly lower, even if the same local current density is used.

As electroplating time passes, the circuit lines in the cavities between the walls of the photoresist are filled. As a result, these surfaces are reached also by contact rolls whose surfaces are less elastic. Alternatively, the surface of narrower circuit lines can be reached, that is contacted with the same elasticity. This also allows the use of several rotatory elements that are arranged behind one another in the direction of transportation in a continuous processing plant and that are of varying elasticity on their surface. In a plant, contact rolls can be used in the direction of transportation, the hardness thereof increasing in the direction of conveyance. Such an arrangement is advantageous because harder rolls are somewhat more resistant to wear so that overall abrasion is reduced. The standard value for the hardness is a value ranging from 2 to 60 Shore A according to DIN 53 505.

The elastic contact materials of choice are composite materials made from metal and plastic, more specifically composite materials that are made from an elastic synthetic material which has a high share of electrically conductive filling materials. They consist of elastomers like caoutchouc, silicone or other elastic synthetic materials which are electrochemically stable. Among those there are also circuit adhesives that are not fully hardening as they are utilized in the electronics manufacturing industry. During manufacturing, an electrically conductive filling material is added by mixture to such materials. A composite material made from metal and synthetic material is created as a result thereof.

The filling materials, also referred to as inclusion components, consist preferably for this application of metal in the form of powders, fibres, needles, cylinders, balls, flakes, felt and other forms. The dimensions of these filling materials range from nanometers to approximately 100 micrometers. The fibre lengths have diameters and lengths ranging from some nanometers to some millimeters. The proportion of the filling material in the contact material as a whole amounts to up to 90 percent by weight. As the proportion of filling material increases, the elasticity of the metal/synthetic material composite decreases and the electrical conductivity increases. Both values are adjusted to the application of concern. All electrochemically stable filling materials that are electrically conductive at the same time are suited to serve as a filling material. Customarily utilized filling materials are for example titanium, niobium, platinum, gold, silver, special steel and electrocoal. Platinized or gold-plated particles like balls of titanium, copper, aluminum or glass may also be employed.

When making a metal/synthetic material composite, a light material like glass, aluminum or titanium is advantageous. The required electrical conductivity of the comparably light particles is created by electroplating with platinum, gold or silver for example. If the titanium or aluminum particles were not coated, metal oxidation would impair a very good electrical conductivity. Metallic hollow balls are particularly advantageous. They have a good electrical conductivity and they are light. The balls can be manufactured with a diameter of 0.2 mm and less. The thickness of the wall may be chosen. It lies within the range of 10 micrometers for example. The filling material in question has a specific gravity that can accurately be adapted to the specific gravity of the elastic material by selecting the dimensions of the balls, more specifically the thickness of their walls. As a result, no separation occurs as the metal/synthetic material composite is being manufactured. The composite is perfectly homogeneous.

In producing the metal/synthetic material composite, the light filling materials do not tend to separate even during hardening. The composite remains very homogeneous so that the electrical conductivity is always high enough. Particles of filling material of very small dimensions, so-called nanostructured composites, yield results that are just as good. In fabricating the elastic and electrically conductive material, the use of metal fibres or metal flakes merely occasions a small separation, that is they yield a homogeneous metal/synthetic material composite. Homogeneity contributes to improve the durability of these elastic, electrical conductors. The same current density is applied to the entire section of the conductor. Local overheating does not occur.

The electrical conductivity of the elastic contact material that may be achieved with these filling materials amounts to $10^{-3}$ $\Omega$cm and in particular cases even to $10^{-4}$ $\Omega$cm. This represents a conductivity which is only approximately ten times lower as compared to the conductivity of the metals like titanium that can be employed for electrolytic processes.

Since the electrical conductivity of the elastic contact material is approximately ten times lower than that of the customarily employed metals, an additional power loss occurs in this material. This is the reason why the thickness of the coating of the contact roll is kept small, more particularly when the rotatory element for placing work in electric contact is to be used for all over electrolytic processing. A coating of the contact material of 3 mm thick for example is sufficient for making contact for patterning.

The rotatory element can be designed as a contact roll. In this event, the contact roll may be provided with an electrically conductive core, the surface of which may for example consist of metal, e.g. special steel or titanium. Metal/synthetic material composites having the required stability and electric conductivity are also suited for the purpose.

The rotation of the contact roll is advantageous for cooling. It allows the heated contact regions to cool down in the electrolyte during one revolution. Another advantage is that the contact is not only formed by an exact surface line of the roll as it is the case with a hard metallic roll of the state of the art. At the contacting point, the elastic contact material forms an area. This area increases with increasing contacting force and higher elasticity. The locally effective current density is considerably reduced as a result thereof. This increased cross section at the respective contact point causes the electric resistance to diminish, power loss, that is, heating, decreasing too as a result thereof.

In a horizontal continuous processing plant, the contact force is formed by a spring force and/or by the own weight of the upper contact rolls for example. A roll located below absorbs the antagonistic force. Therefore, an arrangement of at least two rotatory elements according to the invention is advantageous in which the rotatory elements, contact rolls for example, are arranged in the continuous processing plant at either side of the transportation plane. For this purpose, the upper roll is carried in spaced relationship from the lower roll in such a manner that it is free to move. It accordingly automatically adjusts to the thickness of the board and to the degree of sinking at the contacting surface line. Usually, the lower contact roll is rigidly adjusted in height.

A particularly simple and inexpensive embodiment of a contact roll is obtained when the basic body, that is its electrically conductive core, is merely provided on the surface area with elastic and electrically conductive rings or bands. These rings or bands (contact strips) may be positively inserted in grooves/flutes of the roll, preferably in an annular arrangement, so that, although they may be locked there, they are readily exchangeable and adjustable to the respective function they have to perform. The contact strips preferably extend beyond the surface area of the core of the contact roll.

If the elastic, electrically conductive contact material is only partially applied to the rotatory element (in a spiral groove for example), it is advantageous to isolate those electrically conductive areas that are not coated with the elastic contact material, at least inasmuch as they are immersed into the processing fluid, in order to prevent current from being transmitted to these places. It is thus guaranteed that no electrolytic metal deposition or removal takes place at these places. Electrically nonconductive coatings, more specifically plastic coatings that are made from a chemically stable material such as HALAR® for example, which is also utilized for isolating electroplating racks, are suited for the purpose. The same is true for the front areas of the contact elements which do not serve to transmit current, at least inasmuch as they are immersed in the processing fluid.

The material of choice of the contact strips again is a metal/synthetic material composite. In an alternative embodiment however, a metallic spiral spring with slant windings which is joined into a ring is also suited. Instead of the rings, the elastic materials may also be spirally winded on the roll and fastened at the ends of the contact roll. In all cases, these rings, bands and springs run in flutes in the surface area of the roll's core and protrude beyond it. Only these unreel on the work.

From the stationary power source of the bath and accordingly, from the stationary part of the continuous processing plant, electric current is transmitted to the rotatory element, a contact roll for example, by means of a known sliding contact that rests on a slide way of the roll.

To provide the rotatory element with current, another possibility consists in using a rotating contact (rotary contact). It consists in a tightly closed housing with a rotating area and with a stationary area separated from the latter by a gap. The gap is filled with a free-flowing current transmitting agent, for example an electrically good conducting fluid, suspension or metal powder. The suspension consists of a suspended metal powder as it has been described with the filling materials. This rotating contact is resistant to wear and maintenance-free.

On principle, the rotatory elements according to the invention can be utilized exclusively for placing the work in electric contact. It is however also advantageous when the rotatory elements also serve to convey the work and are provided with a drive for this purpose.

In case the bores in the printed circuit boards have already been contacted with an electrochemically applied layer of copper prior to further processing, it is enough, for further carrying out the method, to accommodate contact rolls for example on one side only, nonconductive supporting rolls being arranged at the opposite, since under these conditions one-sided contact is sufficient.

One roll, on the one side of the transportation plane, is for example designed as a contact roll, while the other roll only serves to convey the printed circuit boards. When the work is conveyed in a horizontal plane, the lower roll may for example be designed as a contact roll, whereas the upper roll only serves to convey the printed circuit boards or vice versa. For this purpose, a combination may be selected that combines for example a contact roll according to the invention with a standard conveying roll (made from synthetic material for example) or with a standard conveying wheel according to the state of the art. Thanks to the very homogeneous current induction of the one-sided contact rolls coated with the elastic and electrically conductive material, the current may also be induced for electrolytically processing the opposite side. The two sides of the printed circuit boards are sufficiently electrically connected to each other via the conductive layer in the holes and via the borders. As the layer thickness increases during electroplating, electrical conductivity of this electrical connection gradually increases. The use on the upper side of plastic rolls for example instead of conductive contact rolls considerably saves costs. Among others, it is not necessary under these conditions to transmit current to the rotating contact roll which additionally is vertically movable.

For this reason, rotatory elements according to the invention may both be used on either side of the transportation plane in the continuous processing plant and only above or only below the transportation plane or alternately above and below the transportation plane. If the contact rolls are advantageously mounted on only one side, but alternately on the top and on the bottom in the direction of transportation, even the shortest printed circuit boards are at least for a time electrically connected to the power source in the bath by way of the contact means.

The distance separating one contact roll from the other in the direction of transportation is selected to permanently keep the printed circuit board that is shortest in the direction of transportation electrically connected to the power source of the bath. This also means that the rear border of the shortest printed circuit board to be processed is still in electric contact with the backward lying contact roll, while the contact roll that follows next already contacts the front border of the same printed circuit board. The upper and lower anodes of the continuous processing plant are located between two contact rolls in the direction of transportation.

In continuous processing plants, the contact rolls may also be arranged outside the liquid bath in front of and behind an electrolytic partial cell or between two or more electrolytic partial cells and additionally in front of and behind the first and the last of these partial cells, in order to prevent the conductive contact rolls from being electrolytically plated. If this is not possible, metal has to be removed from the contact rolls from time to time by changing the poles.

The Figures indicated herein after serve to more fully explain the invention.

FIG. 1a: shows a side view of a contact roll according to the invention with an elastic, electrically conductive coating applied all over it;

FIG. 1b: shows a side view of a contact roll according to the invention with annular contact strips;

FIG. 1c: shows a side view of a contact roll according to the invention with spiral contact strips.

The electrolytic cell with the reservoir for the electrolyte, the pumps, the conveying rolls, the appropriate soluble and insoluble anodes, the devices for generating and feeding current, the nozzles delivering the electrolyte and the squeezing rolls at the input and output stations of the work are not illustrated in the FIGS. 1a through 1c.

FIG. 1a represents the lower contact roll 9 and the upper contact roll 10 that consist of roll cores 1 made from an electrochemically stable, electrically good conducting material such as for example metal (titanium, special steel). The electrically conductive, elastic contact material 2 extends over the entire surface area. It is fastened on the core 1 by conductive vulcanization, adhesion or mechanical fixation such as screws, rivets or clamps. When fixated mechanically, care is to be taken that the elasticity of the coating be not substantially modified at the fastening locations. Bearing journals 8 with the bearings 3 are accommodated on either end of the contact rolls 9, 10. The electric main feeders in the form of sliding rings or sliding contacts 4 or of a tightly closed rotating contact with an electrically conductive and free-flowing filling for transmitting the current are located at least at one end of the contact rolls 9, 10.

FIG. 1*b* illustrates a lower contact roll 9. Its core 1 is provided with flutes in which the annular contact material 5 is positively inserted. When laying out the rings 5, the mechanical tension once the rings are inserted must be so high that the frictional bond of the rings 5 is high enough so that the work 7 can be conveyed without slip. In this case too, the bearing journal 8 of the contact roll 9, the bearing 3 and the main feeder 4 are represented.

FIG. 1*c* also illustrates a lower contact roll 9. Here, the core 1 of the roll is provided with a spiral groove in which the elastic, conductive contact material 6 is positively inserted. In this exemplary embodiment, fastening elements that have not been illustrated in the drawing herein are needed at both ends of the contact roll 9 for fastening the contact material 6, for example by clamping it on the front sides of the core 1.

If the contact rolls 9, 10 are employed inside the electrolyte for electroplating, appropriate shields that have not been illustrated in the drawings 1*a* through 1*c*, shrouds for example, are needed to prevent metal from depositing on the elastic contact material 2, 5, 6 or at least to keep said metal deposition low.

The invention claimed is:

1. Rotatory element for placing board-shaped work electrolytically to be processed in electric contact in a continuous processing plant, wherein the rotatory element (9, 10) is provided at least partially with an elastic, electrically conductive material (2, 5, 6) on its running tread unreeling on the work (7), wherein the rotatory element (9, 10) is designed as a contact spiral.

2. Rotatory element for placing board-shaped work electrolytically to be processed in electric contact in a continuous processing plant, wherein the rotatory element (9, 10) is provided at least partially with an elastic, electrically conductive material (2, 5, 6) on its running tread unreeling on the work (7), wherein the rotatory element (9, 10) is designed as a contact roll and is provided with an electrically conductive core (1), wherein the electrically conductive core (1) is provided on the surface area with at least one flute in each of which an elastic, electrically conductive contact strip (5, 6) is positively inserted that extends beyond the surface area of the core (1), and wherein the at least one contact strip (5) is arranged in the shape of a ring on the surface area.

3. Rotatory element for placing board-shaped work electrolytically to be processed in electric contact in a continuous processing plant, wherein the rotatory element (9, 10) is provided at least partially with an elastic, electrically conductive material (2, 5, 6) on its running tread unreeling on the work (7), wherein the rotatory element (9, 10) is designed as a contact roll and is provided with an electrically conductive core (1), wherein the electrically conductive core (1) is provided on the surface area with at least one flute in each of which an elastic, electrically conductive contact strip (5, 6) is positively inserted that extends beyond the surface area of the core (1), and wherein the at least one contact strip (6) is spirally arranged on the surface area.

4. Rotatory element for making electric contact according to claim 3, wherein the contact strip (6) is fastened to the ends of the contact roll (9, 10).

5. Rotatory element for placing board-shaped work electrolytically to be processed in electric contact in a continuous processing plant, wherein the rotatory element (9, 10) is provided at least partially with an elastic, electrically conductive material (2, 5, 6) on its running tread unreeling on the work (7), wherein at least one sliding contact (4) is provided for supplying the rotatory element (9, 10) with current.

6. Method of placing board-shaped work electrolytically to be processed in electric contact in continuous processing plants, in which the work is conveyed through the continuous processing plant and is thereby placed in electric contact with the assistance of at least one rotatory element, wherein the work (7) is at least partially placed in electric contact by way of an elastic, electrically conductive material (2, 5, 6) that is applied on the running tread of the at least one rotatory element (9, 10) unreeling on the work (7), wherein the work (7) is placed in electric contact by way of an elastic, electrically conductive material (2, 5, 6) which is applied on the surface area of the at least one rotatory element (9, 10) designed as a contact spiral.

7. Rotatory element for placing board-shaped work electrolytically to be processed in electric contact in a continuous processing plant, wherein the rotatory element (9, 10) is provided at least partially with an elastic, electrically conductive material (2, 5, 6) on its running tread unreeling on the work (7), wherein at least one closed rotating contact having an electrically conductive and free-flowing filling for transmitting the current is provided for supplying the rotatory element (9, 10) with current.

\* \* \* \* \*